(12) United States Patent
Ciavatti et al.

(10) Patent No.: US 9,087,706 B2
(45) Date of Patent: Jul. 21, 2015

(54) METHODS OF FORMING BIPOLAR DEVICES AND AN INTEGRATED CIRCUIT PRODUCT CONTAINING SUCH BIPOLAR DEVICES

(71) Applicant: GLOBALFOUNDRIES Inc., Grand Cayman (KY)

(72) Inventors: Jerome Ciavatti, Hopewell Junction, NY (US); Roderick Miller, Mechanicville, NY (US); Marc Tarabbia, Pleasant Valley, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/580,834

(22) Filed: Dec. 23, 2014

(65) Prior Publication Data

US 2015/0108580 A1    Apr. 23, 2015

Related U.S. Application Data

(62) Division of application No. 13/930,611, filed on Jun. 28, 2013, now Pat. No. 8,975,130.

(51) Int. Cl.
| H01L 21/8238 | (2006.01) |
| H01L 27/06 | (2006.01) |
| H01L 29/78 | (2006.01) |
| H01L 29/08 | (2006.01) |
| H01L 29/735 | (2006.01) |

(52) U.S. Cl.
CPC ........ *H01L 27/0623* (2013.01); *H01L 29/0804* (2013.01); *H01L 29/735* (2013.01); *H01L 29/7851* (2013.01)

(58) Field of Classification Search
CPC ............ H01L 29/7851; H01L 29/0804; H01L 29/735
USPC .......................................................... 438/202
See application file for complete search history.

(56) References Cited

U.S. PATENT DOCUMENTS

| 5,374,845 | A | 12/1994 | Havemann |
| 6,281,060 | B1 | 8/2001 | Igarashi et al. |
| 2001/0023978 | A1 | 9/2001 | Igarashi et al. |
| 2010/0001369 | A1* | 1/2010 | Chuang et al. ............... 257/526 |
| 2014/0302660 | A1* | 10/2014 | Liu et al. ...................... 438/424 |

* cited by examiner

*Primary Examiner* — Ajay K Arora
(74) *Attorney, Agent, or Firm* — Amerson Law Firm, PLLC

(57) ABSTRACT

One method disclosed herein includes performing at least one common process operation to form a plurality of first gate structures for each of a plurality of field effect transistors and a plurality of second gate structures above a region where a bipolar transistor will be formed and performing an ion implantation process and a heating process to form a continuous doped emitter region that extends under all of the second gate structures. A device disclosed herein includes a first plurality of field effect transistors with first gate structures, a bipolar transistor that has an emitter region and a plurality of second gate structures positioned above the emitter region, wherein the bipolar transistor comprises a continuous doped emitter region that extends laterally under all of the plurality of second gate structures.

10 Claims, 9 Drawing Sheets

METHODS OF FORMING BIPOLAR DEVICES AND AN INTEGRATED CIRCUIT PRODUCT CONTAINING SUCH BIPOLAR DEVICES

CROSS-REFERENCE TO RELATED APPLICATION

This is a divisional of co-pending application Ser. No. 13/930,611, filed Jun. 28, 2013.

BACKGROUND OF THE INVENTION

1. Field of the Invention

Generally, the present disclosure relates to the manufacture of semiconductor devices, and, more specifically, to various methods of forming bipolar transistor devices and to an integrated circuit product that includes such a bipolar device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. So-called metal oxide field effect transistors (MOSFETs or FETs) represent one important type of circuit element used when manufacturing integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If the voltage applied to the gate electrode is less than the threshold voltage of the transistor device, then there is no current flow through the device (ignoring undesirable leakage currents, which are relatively small). However, when voltage that is equal to or less than the threshold voltage is applied to the gate electrode, the channel region becomes conductive, and electrical current is permitted to flow between the source region and the drain region through the conductive channel region. Field effect transistors can be either N-type (NFET) devices or P-type (PFET) devices that are made with different type doping materials. In general, N-type devices are turned "ON" and P-type devices are turned "OFF" when a logically high voltage is applied to the gate electrode of such devices. Conversely, N-type devices are turned "OFF" and P-type devices are turned "ON" when a logically low voltage is applied to the gate electrode of such devices. Integrated circuit products may be manufactured using both N-type and P-type devices that are formed on the same chip or substrate. This is generally referred to as CMOS (Complementary Metal Oxide Semiconductor) technology.

Another type of semiconductor device is a so-called bipolar junction transistor. A bipolar transistor is comprised of three doped regions and it has two PN junctions. More specifically, a bipolar transistor is comprised of a collector region, a base region positioned within the collector region and an emitter region positioned within the base region. In a bipolar transistor, current flows from the emitter region, through the base region to the collector region. In a bipolar device, there is no current flow in the device unless the base is turned "ON." Bipolar devices come in two different arrangements: NPN devices and PNP devices, which refer to the type of dopant used for the collector region, base region and emitter region, respectively, with NPN bipolar transistors being more prevalent in modern integrated circuit products. Bipolar devices typically exhibit large drive currents and can operate with a high degree of noise immunity. However, circuits made with bipolar transistors tend to exhibit high power consumption and they have relatively poor packing density.

BiCMOS is a technology wherein bipolar devices and both N-type and P-type field effect transistors are formed on the same substrate in an effort to take advantage of desirable characteristics of such devices while attempting to limit the impact of the negative characteristics of such devices. For example, BiCMOS circuits can produce more drive current than can a comparably sized circuit made using only CMOS technology.

Figure 1A:
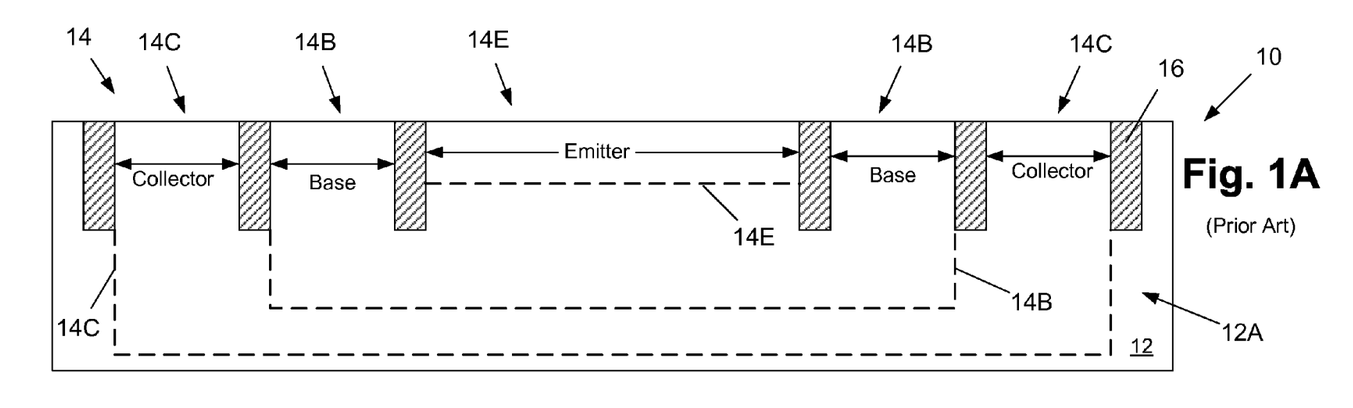
FIGS. 1A-1H depict one illustrative prior art method of forming a bipolar transistor device.
Figure 1B:
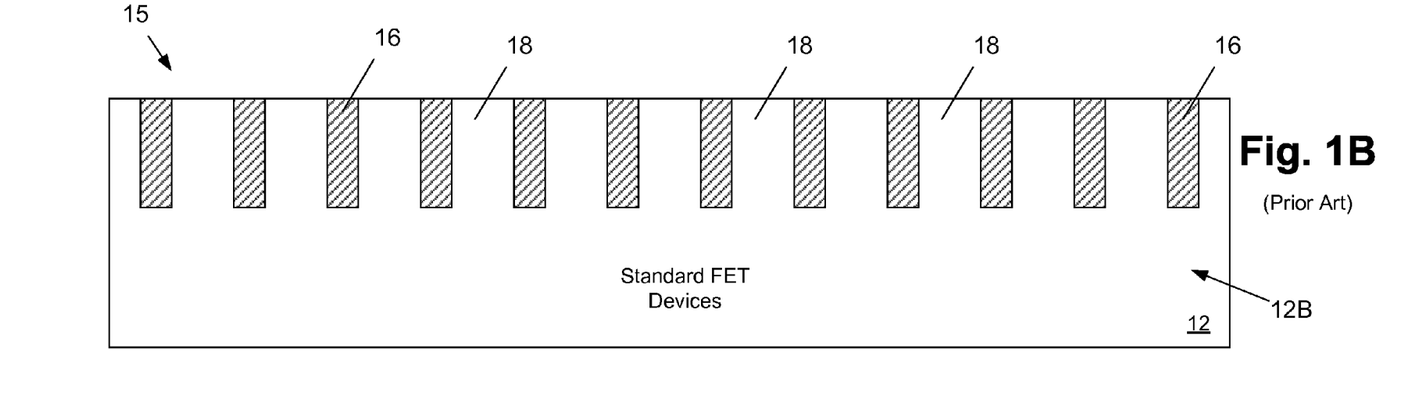

FIGS. 1A-1H depict one illustrative prior art integrated circuit product 10 comprised of both bipolar transistors and N- and P-type field effect transistors formed on a common substrate or chip, i.e., a product manufactured using BiCMOS technology. As shown in FIGS. 1A-1B, the common semiconductor substrate 12 comprises a region 12A, where an illustrative bipolar transistor device 14 will be formed, and a region 12B, where a plurality of standard N-type and P-type field effect transistor devices 15 will be formed. In such an application, the bipolar transistor devices 14 may be used as part of the read-write circuitry for a memory cell to reduce access time, while the standard N-type and P-type field effect transistor devices 15 may be used in manufacturing logic circuits, etc.

At the point of fabrication depicted in FIGS. 1A-1B, illustrative isolation regions 16 have been formed in the substrate regions 12A, 12B using known techniques. The isolation structures 16 in the substrate region 12B define active regions 18 where the standard N-type and P-type field effect transistor devices 15 will be formed. The isolation structures 16 in the substrate region 12A define regions where the emitter region 14E, the base region 14B and the collector region 14C of the bipolar device 14 will be formed. The doped areas that define these regions are depicted in dashed lines in FIG. 1A as such doped regions have not yet been formed in the substrate region 12A. In manufacturing the product 10, various doped regions or wells (not shown) will also be formed in the active regions 18 of the substrate region 12A. As is well known to those skilled in the art, appropriate patterned masking layers are used when forming the various doped regions in the substrate 12. The timing as to when the various doped regions are formed may vary depending upon the particular application. In general, to the extent possible, a device manufacturer will make all implants of the same type and dose, e.g., N-type dopants across the entire wafer using a single masking layer to save time and cost. Thus, in general, when an ion implantation process is performed to introduce N-type dopants into some of the active regions 18 in the region 12B, e.g., to form N-doped source/drain regions for N-type transistor devices 15, the masking layer used during this implant process will be formed such that the desired region of the bipolar transistor 14 that is to receive an N-type dopant, e.g., an N-doped emitter region 14E, will also be implanted with N-type dopant material at the same time.

Figure 1C:
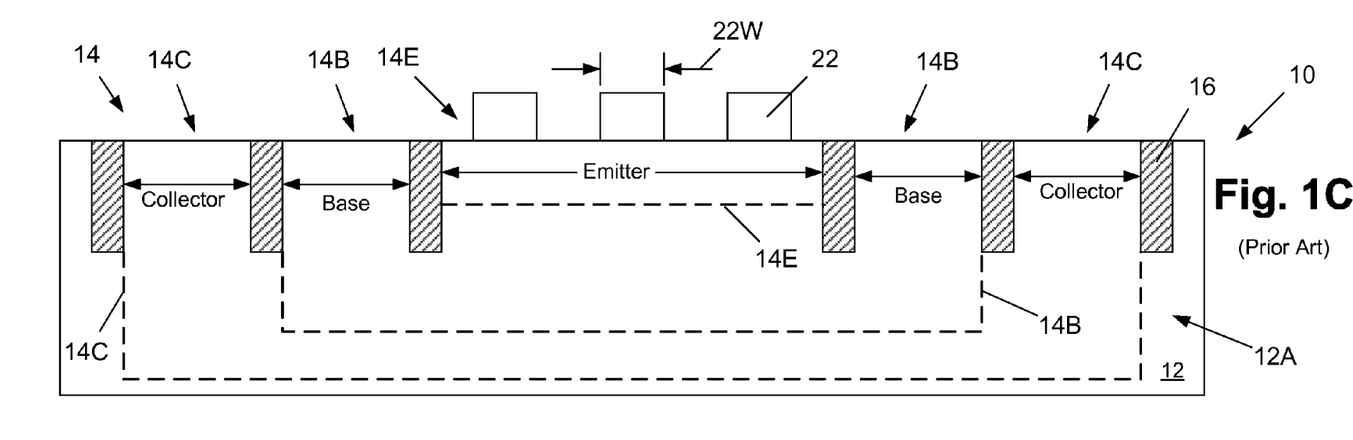
Figure 1D:
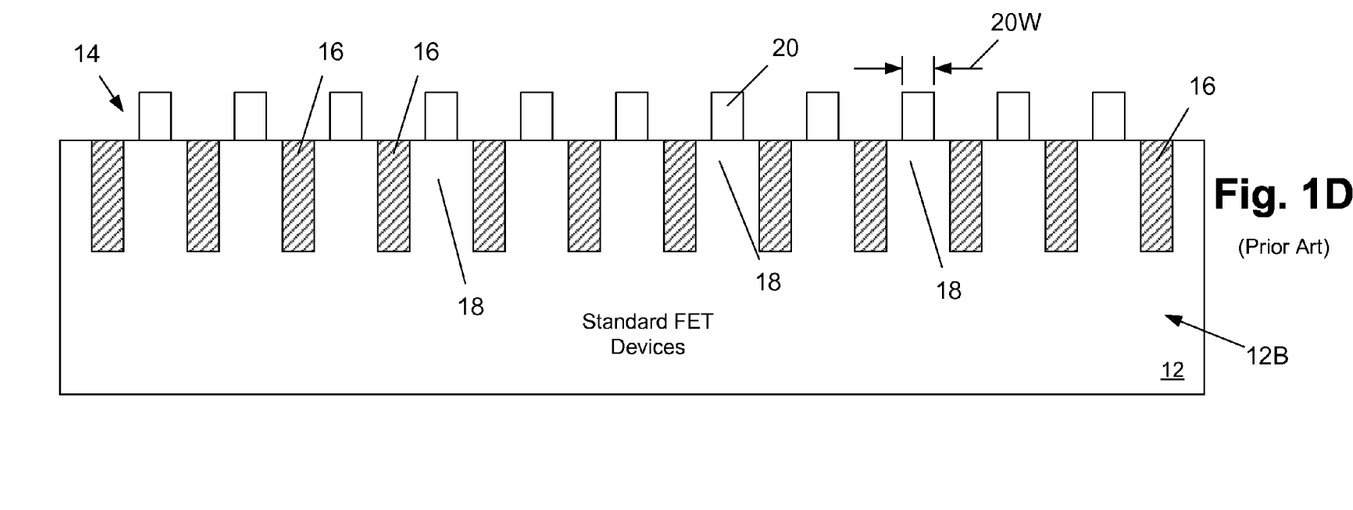

FIGS. 1C-1D depict the product 10 at a later stage of fabrication wherein illustrative gate structures 20 have been formed above the active regions 18 in the region 12B of the substrate and gate structures 22 have been formed above the emitter region 14E of the bipolar device 14. Various doped regions may have been formed in the substrate regions 12A, 12B for various reasons, but such doped regions are not depicted in the attached drawings so as to not needlessly complicate the current discussion. The gate structures 20, 22 are intended to be representative in nature. However, in one illustrative embodiment, the gate structures 20, 22 may be so-called "dummy" gate structures that are used when the gate structures of the device 10 are made using a so-called "replacement gate" process. In general, the replacement gate process involves formation of a dummy gate structure, comprised of a sacrificial layer of gate insulation material, e.g., silicon dioxide, and a sacrificial gate electrode structure, e.g., polysilicon, that effectively serves as placeholder materials while other processing activities are performed on the device, e.g., while one or more ion implantation processes are performed to form source/drain regions and while an activation anneal process is performed to activate the implanted dopant materials. Eventually, the sacrificial gate electrode and sacrificial gate insulation layer are removed to thereby define a gate cavity where the replacement gate structure, i.e., the high-k gate insulation layer and one or more metal layers, is formed in the gate cavity.

The gate structures 22 are not needed above the emitter region 14E for purposes of operating the bipolar device 14, but they are typically formed above bipolar device 14 in an effort to achieve better uniformity when performing the planarization process that is performed when making transistor devices using a replacement gate technique. Typically, the critical dimension or width 20W of the gate structures 20 is less than the critical width 22W of the gate structures 22 formed above the emitter 14E.

Figure 1E:
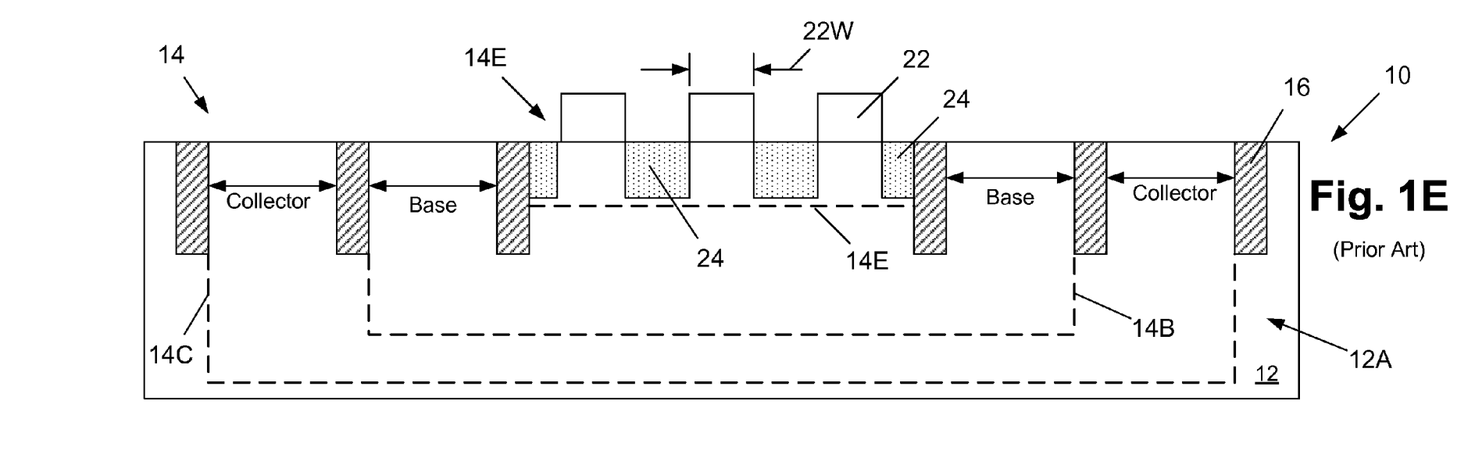
Figure 1F:
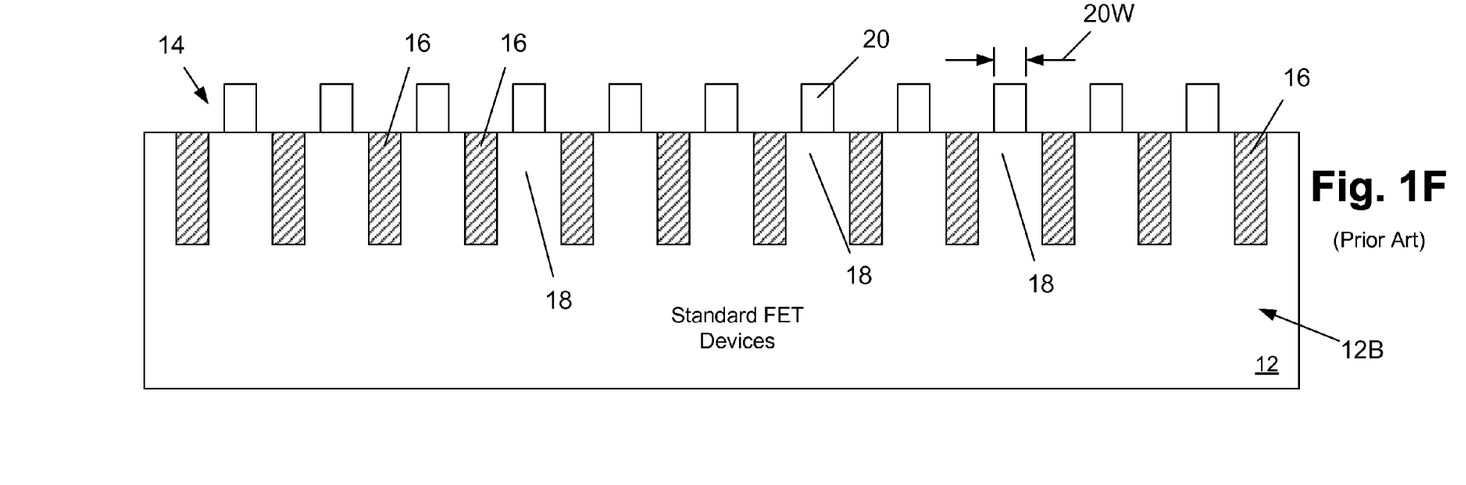

FIGS. 1E-1F depict the product 10 at a point in fabrication wherein an emitter on implantation process is performed as part to the process to define the doped region that will constitute the emitter region 14E. Note that, various doped regions may have been formed in the substrate regions 12A, 12B in the process flow for various reasons, e.g., halo implant regions, extension implant regions, the collector region 14C, the base region 14B, etc., but they are not depicted in the attached drawings so as to not needlessly complicate the current discussion. As depicted in FIG. 1E, the above-described ion implantation process results in the formation of spaced-apart doped regions 24 in the area where the emitter region 14E will be formed. The emitter ion implantation process is typically performed using a dopant dose of about $1e^{15}$-$4e^{15}$ ions/cm$^2$ and an energy level that falls within the range of about 10-30 keV. Of course, the type of dopant used to form the spaced-apart doped regions 24 depends upon whether the device 14 is an NPN device or a PNP device. Importantly, during the emitter ion implantation step, the gate structures 22 act as an implantation mask, thereby resulting in the spaced-apart doped regions 24.

Figure 1G:
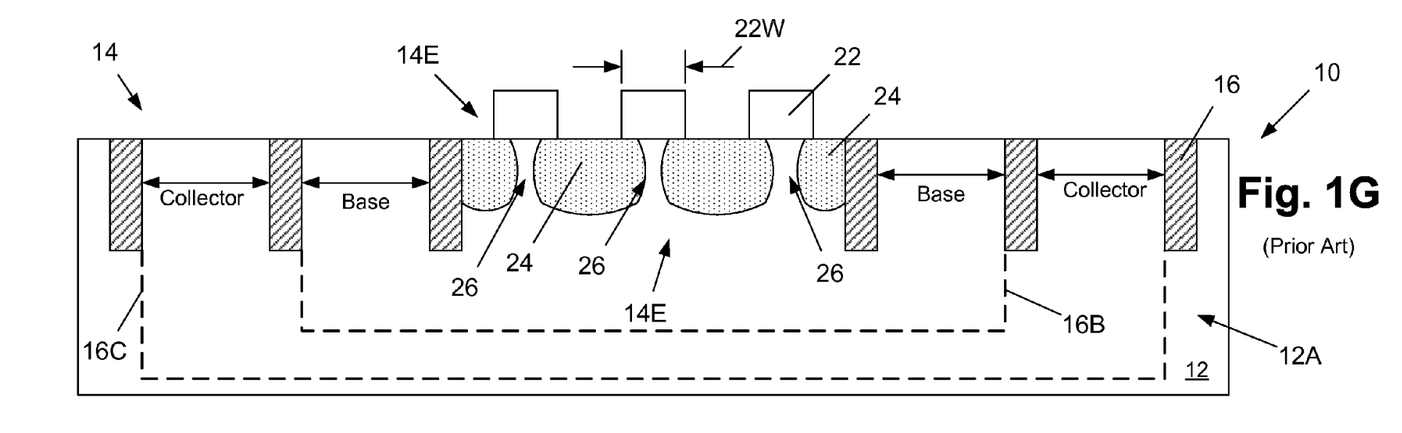
Figure 1H:
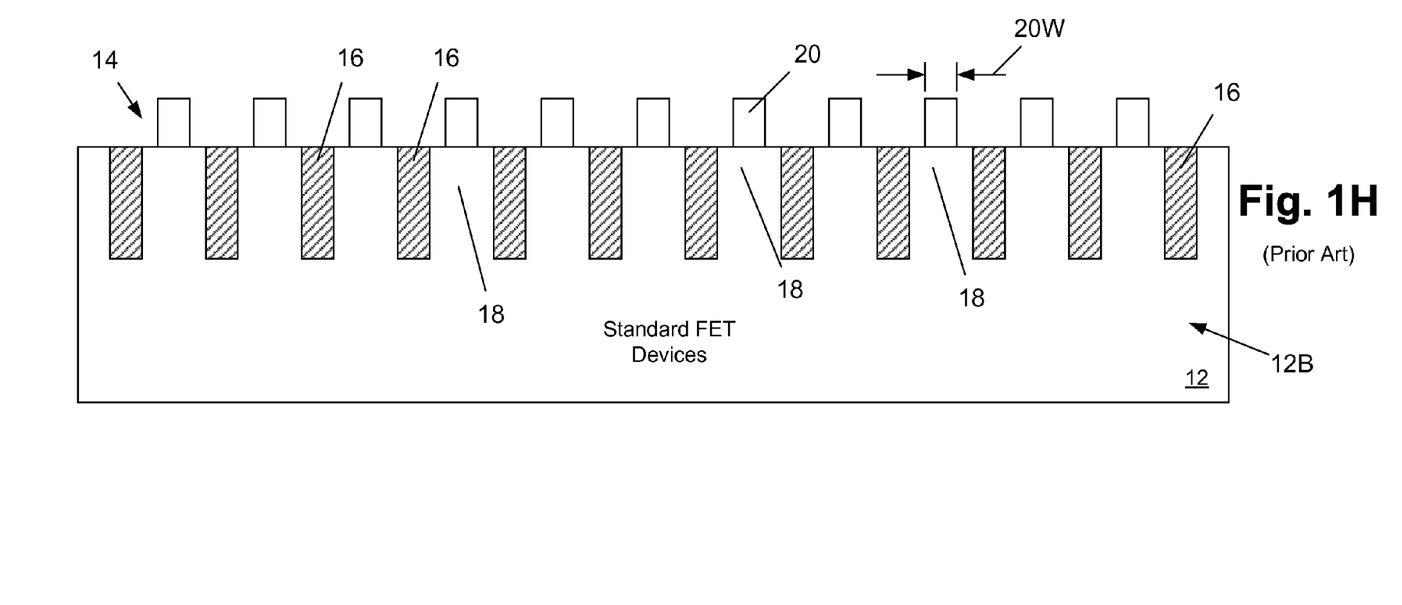

FIGS. 1G-1H depict the product after a heating process, such as an activation anneal process, has been performed to activate at least the implanted dopant materials in the spaced-apart doped regions 24 and to repair damage to the substrate 12 due to the performance of one or more ion implantation processes. While this heating process causes the dopant materials in the spaced-apart doped regions 24 to migrate, as simplistically depicted in FIG. 1G, due to the initial spacing between the spaced-apart doped regions 24, after the heating process is completed, there are gaps or spaces 26 where dopant material is not present in sufficient quantity to its intended purpose. In some cases, there may be a complete absence of any of the dopant materials included in the doped region 24 in such spaces 26. The spaces 26 are due, at least in part, to the fact that the emitter implant process is preformed through the "mask layer" that is comprised of the dummy gate structures 22. The formation of such spaces 26 in the emitter region 14E effectively results in a decrease of the size/effectiveness of the area of the emitter region 14E. As a result, the emitter region 14E must be sized large than is necessary to account for the creation of the non-effective spaces 26 in the emitter region 14E that are present when forming the product using this illustrative prior art technique. Such an increase in the physical size of the emitter region 14E is highly undesirable as it will increase the overall physical size of the resulting chip, which is directly contrary to the constant demand to reduce the overall size and weight of integrated circuit products.

The present disclosure is directed to various methods of forming bipolar transistor devices and to an integrated circuit product that includes such a bipolar device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming bipolar transistor devices and to an integrated circuit product that includes such a bipolar device. In one example, the method disclosed herein includes forming a plurality of first active regions in a first region of a semiconductor substrate wherein a field effect transistor will be formed in and above each of the first active regions, forming a second active region in a second region of the semiconductor substrate wherein a bipolar transistor will be formed, and performing at least one common process operation to form a first gate structure above each of the first active regions for each of the field effect transistors and a plurality of second gate structures above the second active region where said bipolar transistor will be formed, with the plurality of second gate structures in position above the second active region, performing at least one ion implantation process to implant dopant material into the second active region so as to form an emitter region for the bipolar transistor and, after performing the at least one ion implantation process, performing at least one heating process to activate the implanted dopant material and to form a continuous doped emitter region that extends under all of the plurality of second gate structures.

Another illustrative method disclosed herein involves forming a plurality of first active regions in a first region of a semiconductor substrate wherein a field effect transistor will be formed in and above each of the first active regions, forming a second active region in a second region of the semiconductor substrate wherein a bipolar transistor will be formed, performing at least one common process operation to form a first dummy gate structure above each of the first active regions for each of the field effect transistors and a plurality of second dummy gate structures above the second active region where the bipolar transistor will be formed and, with the plurality of second dummy gate structures in position above the second active region, performing at least one ion implantation process to implant dopant material into the second active region so as to form an emitter region for the bipolar transistor. In this example, the method further comprises, after performing the at least one ion implantation process, performing at least one heating process to activate the implanted dopant material in the second active region and to form a continuous doped emitter region that extends under the plurality of second dummy gate structures, performing at least one process operation to remove at least some materials of the first and second dummy gate structures and thereby define a plurality of first and second gate cavities and forming a final gate structure in each of the first gate cavities and a gate structure in each of the second cavities.

One illustrative device disclosed herein includes a first plurality of field effect transistor devices positioned in and above a first region of a semiconductor substrate, wherein each of the first plurality of field effect transistors comprises a first gate structure, a bipolar transistor formed in and above a second region of the semiconductor substrate, wherein the bipolar transistor comprises a continuous doped emitter region and a plurality of second gate structures positioned above the continuous doped emitter region, wherein the continuous doped emitter region extends laterally under all of the plurality of second gate structures.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming bipolar transistor devices and to an integrated circuit product that includes such a bipolar device. Moreover, as will be readily apparent to those skilled in the art upon a complete reading of the present application, the methods disclosed herein may be employed in fabricating a variety of integrated circuit products, including, but not limited to, logic devices, memory devices, etc. With reference to the attached figures, various illustrative embodiments of the methods and devices disclosed herein will now be described in more detail.

FIGS. 2A-2J depict one illustrative method disclosed herein for forming bipolar transistor devices and an illustrative integrated circuit product 100 that includes such a bipolar device. In the illustrative example depicted herein, the integrated circuit product 100 includes both bipolar transistors and N- and P-type field effect transistors formed on a common substrate or chip 112, i.e., a product manufactured using BiCMOS technology. The substrate 112 may have a variety of configurations, such as the depicted bulk substrate configuration, or it may be the active layer of a so-called silicon-on-insulator (SOI) substrate. The substrate 112 may be made of silicon or it may be made of materials other than silicon. Thus, the terms "substrate" or "semiconductor substrate" should be understood to cover all semiconductor materials and all forms of such semiconductor materials.

Figure 2A:
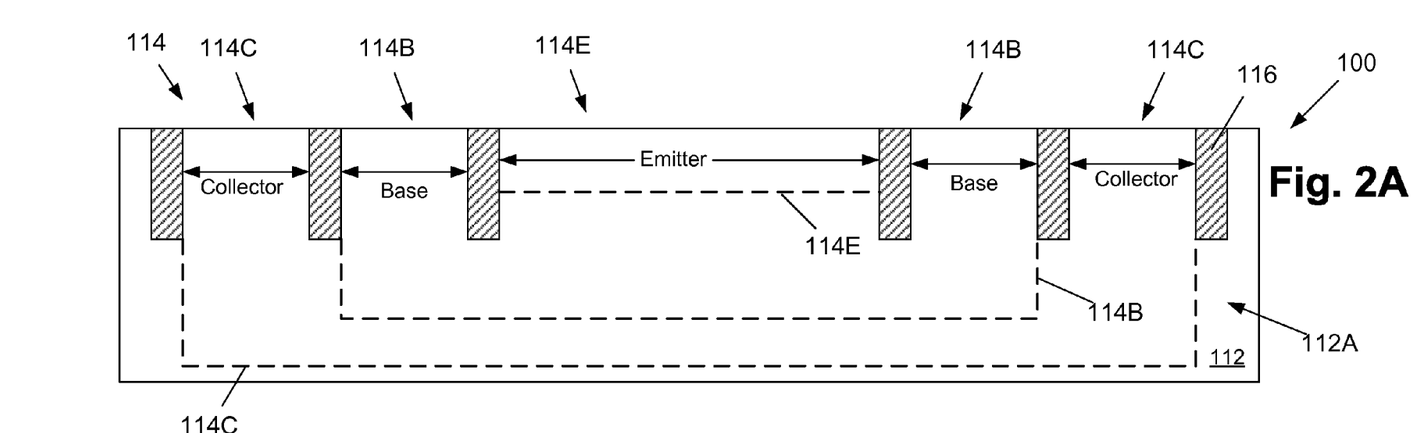
FIGS. 2A-2J depict one illustrative method disclosed herein for forming bipolar transistor devices and an illustrative integrated circuit product that includes such a bipolar device.
Figure 2B:
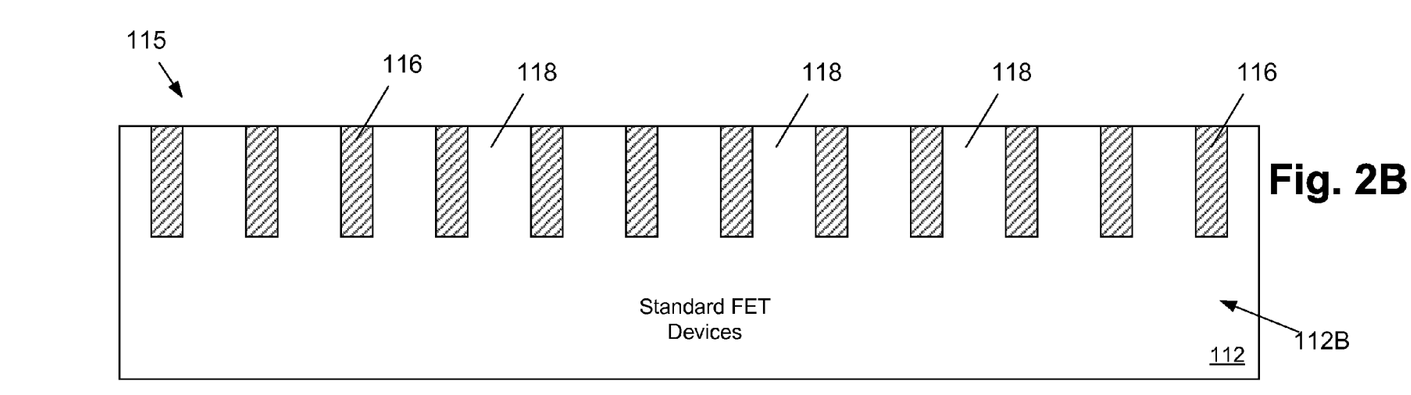

As shown in the FIGS. 2A-2B common semiconductor substrate 112 comprises a region 112A, where an illustrative bipolar transistor device 14 will be formed, and a region 112B, where a plurality of standard N-type and P-type field effect transistor devices be formed. At the point of fabrication depicted in FIGS. 2A-2B, illustrative isolation regions 116 have been formed in the substrate regions 112A, 112B using known techniques. The isolation structures 116 in the substrate region 112B define active regions 118 where the standard N-type and P-type field effect transistor devices 115 will be formed. The isolation structures 116 in the substrate region 112A define regions where the emitter region 114E, the base region 114B and the collector region 114C of the bipolar device 114 will be formed. The doped areas that define these regions are depicted in dashed lines in FIG. 2A as such doped regions have not yet been formed in the substrate region 112A. In manufacturing the product 100, various doped regions or wells (not shown) will also be formed in the active regions 118 of the substrate region 112B. As is well known to those skilled in the art, appropriate patterned masking layers are used when forming the various doped regions in the substrate 112. The timing as to when the various doped regions are formed may vary depending upon the particular application. In general, to the extent possible, a device manufacturer will make all implants of the same type and dose, e.g., N-type dopants, across the entire wafer using a single masking layer to save time and cost. Thus, in general, when an ion implantation process is performed to introduce N-type dopants into some of the active regions 118 in the region 112B, e.g., to form N-doped source/drain regions for N-type transistor devices 115, the masking layer used during this implant process will be formed such that the desired region of the bipolar transistor 114 that is to receive an N-type dopant, e.g., an N-doped emitter region 114E, will also be implanted with N-type dopant material at the same time.

Figure 2C:
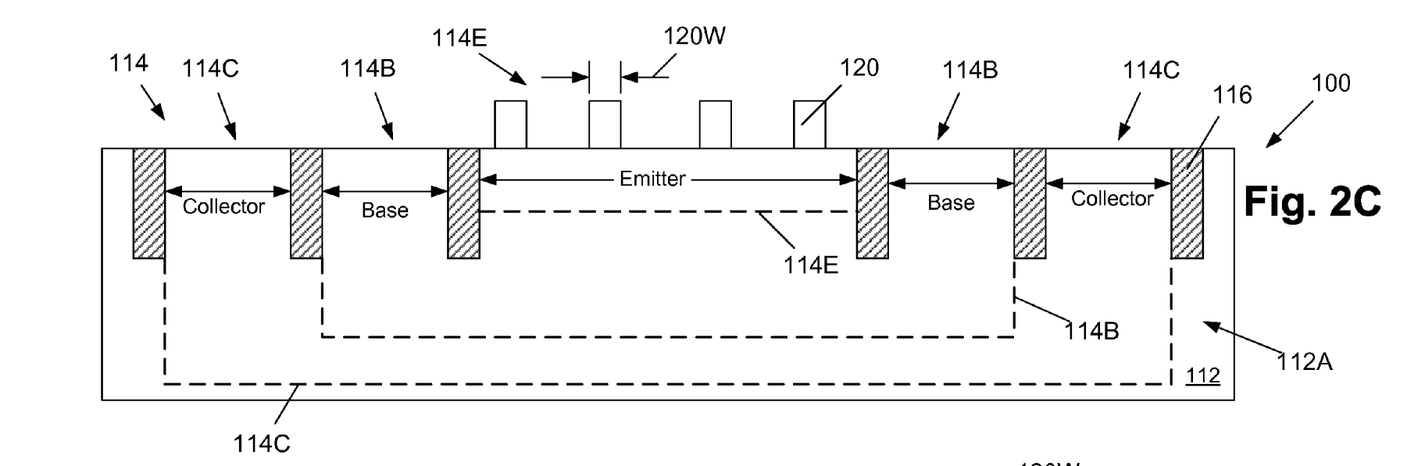
Figure 2D:
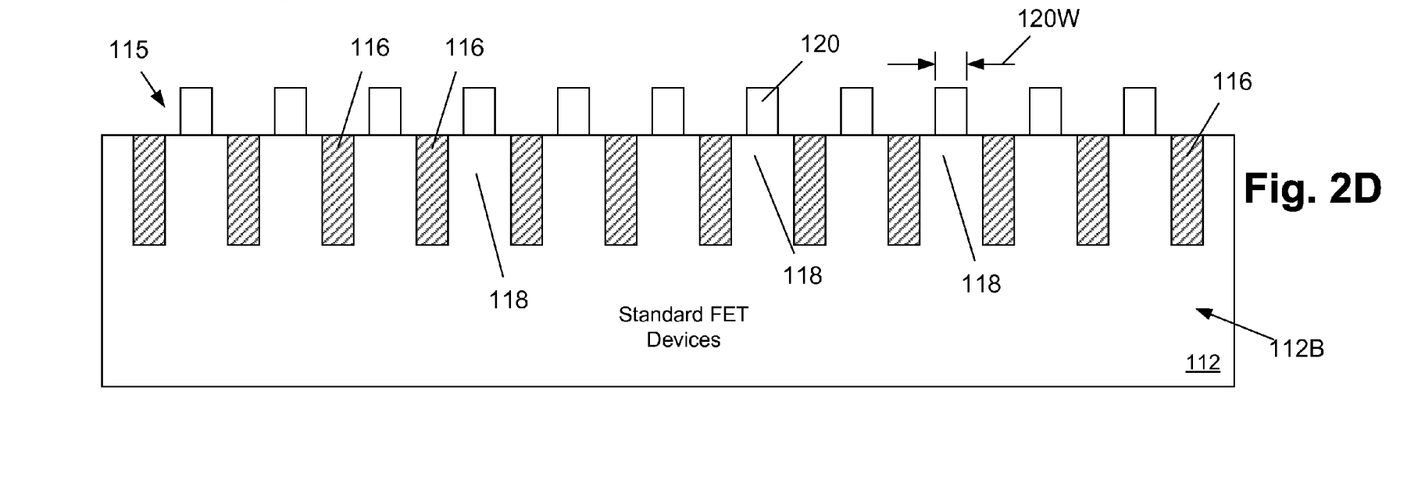

FIGS. 2C-2D depict the product 100 at a later stage of fabrication wherein at least one common process operation has been performed to form a plurality of illustrative gate structures 120. That is, the gate structures 120 were formed at the same time by performing the same process operations, e.g., deposition, etching, polishing, etc. As depicted, the gate structures 120 were formed above the active regions 118 in the region 112B and above the active region where the emitter region 114E of the bipolar device 114 will be formed. If desired, additional gates structures 120 could have also been formed above the portions of the substrate 112 where the collector region 114C and the base region 114B will be formed. However, for ease of disclosure, the following drawings will only depict formation of the gate structures 120 above the region where the emitter 114E will be formed.

At this point in fabrication, various doped regions may have been formed in the substrate regions 112A, 112B for various reasons, but such doped regions are not depicted in the attached drawings so as to not obscure the presently disclosed inventions. The gate structures 120 have a width or critical lateral dimension 120W that may include any sidewall spacers of shown) formed adjacent the sacrificial gate electrode of the gate structure 120. The gate structures 120 are intended to be representative in nature. However, in one illustrative embodiment, the gate structures 120 may be so-called "dummy" gate structures that are used when the gate structures of the device 100 are made using a so-called "replacement gate" process. As noted above, in the replacement gate process, the sacrificial gate electrode and sacrificial gate insulation layer of the dummy gate structures 120 are removed to thereby define a gate cavity where the replacement gate structure, i.e., the high-k gate insulation layer and one or more metal layers, is formed in the gate cavity. In one illustrative embodiment, the gate structures 120 may have a width 120W (which includes any sidewall spacers) that falls within the range of about 16-30 nm. The gate structures 120 may have a pitch that falls within the range of about 60-120 nm. Importantly, in one illustrative embodiment, the gate structures 120 that are formed above the regions 112A, 112B are identical in terms of width, materials and pitch spacing and they may be formed above the regions 112A, 112B at the same time. This is in stark contrast to the device 10 discussed in the background section of this application wherein the gate structures 20 and 22 had significantly differing widths. For example, in one embodiment, the gate structure 120 may have an overall width 120W (including any sidewall spacer structure) that falls within the range of about 16-30 nm. In one embodiment, the pitch between the gate structures 120 may be about 60-120 nm.

Figure 2E:
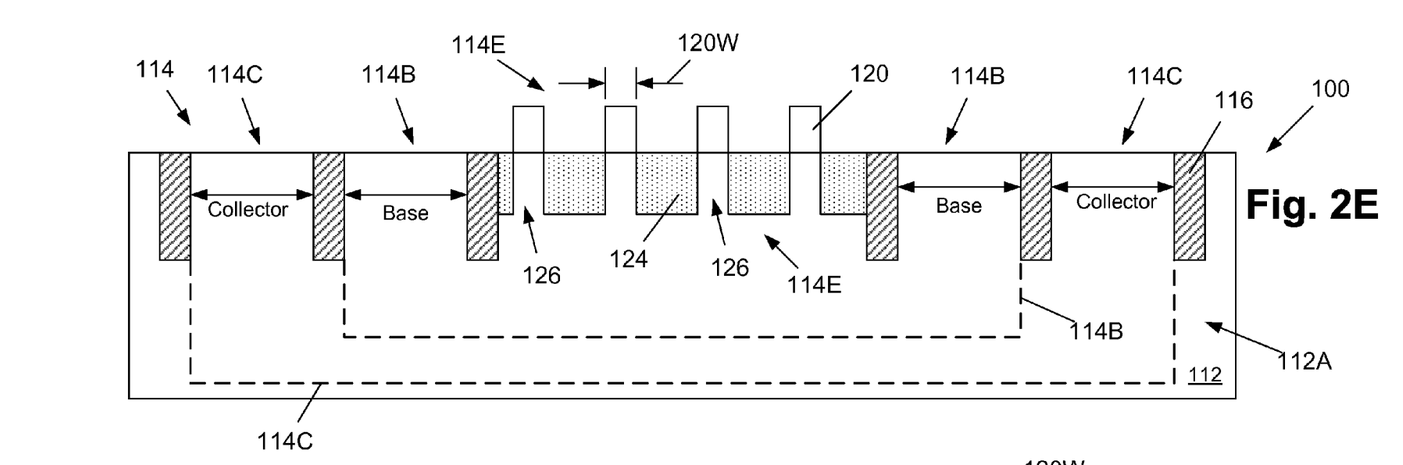
Figure 2F:
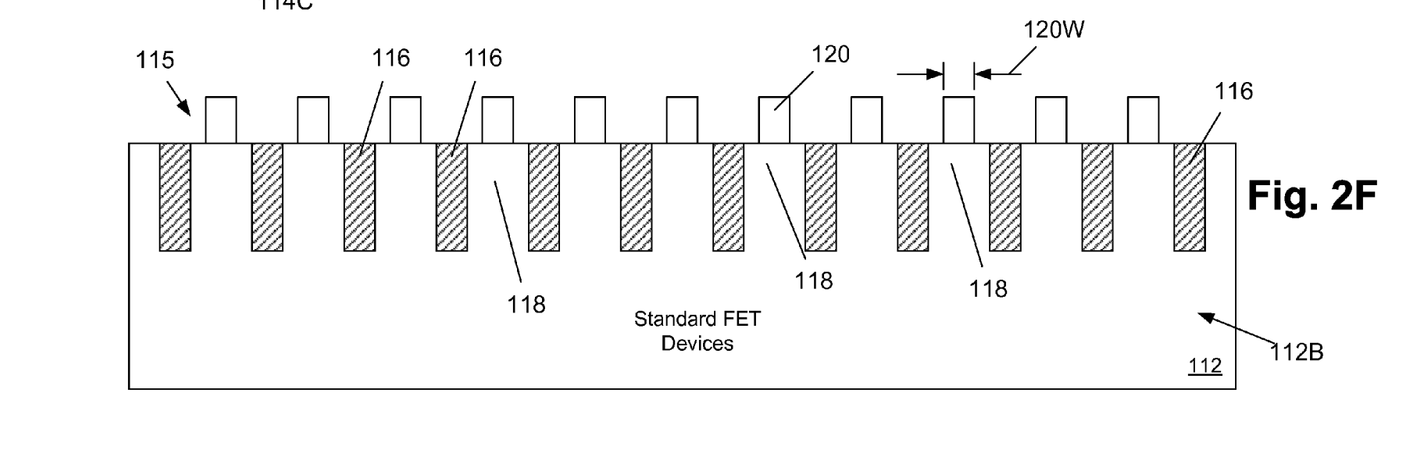

FIGS. 2E-2F depict the product 100 at a point in fabrication wherein an emitter ion implantation process was performed as part to the process to define the doped region that will constitute the emitter region 114E for the bipolar device 114. Note that, various other additional doped regions may have been formed in the substrate regions 112A, 112B at this point in the manufacturing process flow for various reasons, e.g., halo implant regions, extension implant regions, the collector region 114C, the base region 114B, etc. However, such additional doped regions are not depicted in the attached drawings so as to not obscure the presently disclosed inventions.

As depicted in FIG. 2E, the above-described ion implantation process results in the formation of spaced-apart doped regions 124 in the area where the emitter region 114E will be formed. The emitter ion implantation process is typically performed using a dopant dose of about $1e^{15}$-$4e^{15}$ ions/cm$^2$ and an energy level that falls within the range of about 10-80 keV. Note that, in one embodiment, the emitter ion implant process is performed at a significantly higher implant energy, e.g., about 10-25% higher in some cases. Stated numerically, the emitter ion implantation process may be performed using an implant energy falling within the range of about 20-100 keV. The dopant dose used during the emitter ion implantation process may also vary depending upon the particular application, e.g., in one embodiment, the dopant dose may fall within the range of about $3e^{14}$-$1e^{16}$ ions/cm$^2$. Of course, the type of dopant used to form the spaced-apart doped regions 124 for the emitter region 114E depends upon whether the device 114 is an NPN device or a PNP device.

As noted above, during the emitter ion implantation step, the gate structures 120 act as an implantation mask, thereby resulting in the spaced-apart doped regions 124 formed in the emitter region 114E, as shown in FIG. 2E. However, due to the fact that the gate structures 120 are smaller than the gate structures 22 discussed in the background section of this application, there is less distance between adjacent gate structures 120 formed above the emitter region 114. Correspondingly, there is less distance between the spaced-apart doped regions 124.

Figure 2G:
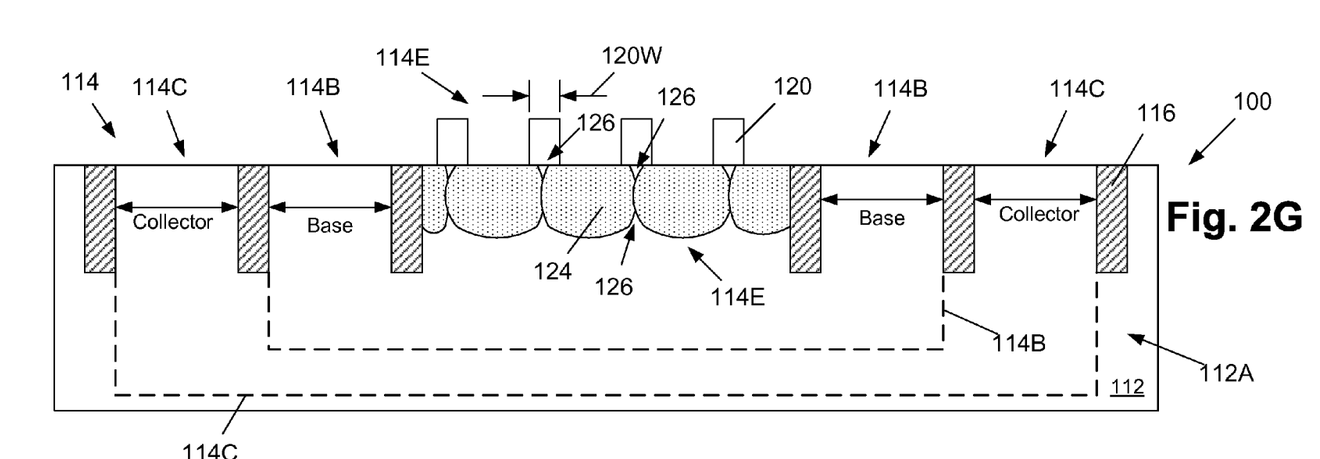
Figure 2H:
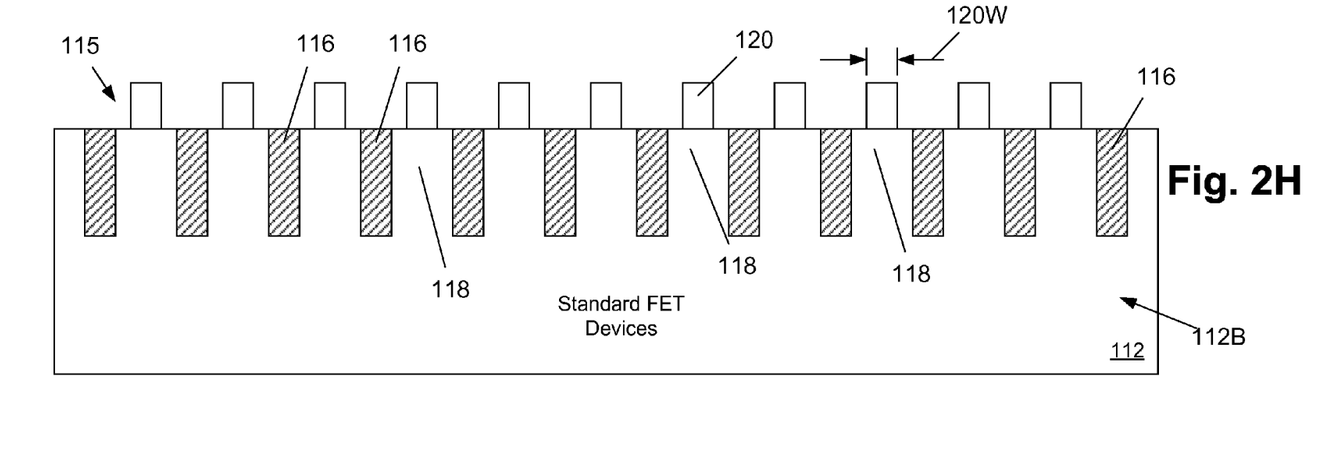

FIGS. 2G-2H depict he product 100 after a heating process, such as an activation anneal process, has been performed to activate at least the implanted dopant materials in the spaced-apart doped regions 124 and to repair damage to the substrate 112 due to the performance of one or more ion implantation processes. In one illustrative embodiment, the heating process may be performed at a temperature that falls within the range of about 900-1200° C. During this heating process, implanted dopant materials in the spaced-apart doped regions 124 migrate or move, as simplistically depicted in FIG. 2G. Importantly, due to, among other things, the greater implant energy used in the emitter ion implant process disclosed herein as compared to the prior art emitter implant process, the doped regions 124 tend to migrate closer to one another as compared to the situation depicted with respect to the spaces 26 described in the background section of this application. As indicated, the width 120W of the gate structures 120, and the spacing between the gate structures 120, is less than the width 22W of and spacing between the gate structures 22 on the prior art device 10 discussed in the background section of this application. Accordingly, the gaps or spaces 126 between the spaced-apart doped regions 124 of the device 100 after the heating process is completed, i.e., regions where dopant material from the regions 124 is not present in sufficient quantity to serve its intended purpose, may be significantly reduced in size as compared to the gaps or spaces 26 for the prior art device 10 discussed in the background section of this application. In some cases, there may be a complete absence of any such regions 126 on the device 100 disclosed herein, i.e., the dopant materials in the regions 124 may substantially merge completely together so as to form a continuous doped emitter region that extends under the plurality of gate structures 120 positioned above the emitter region.

Figure 2I:
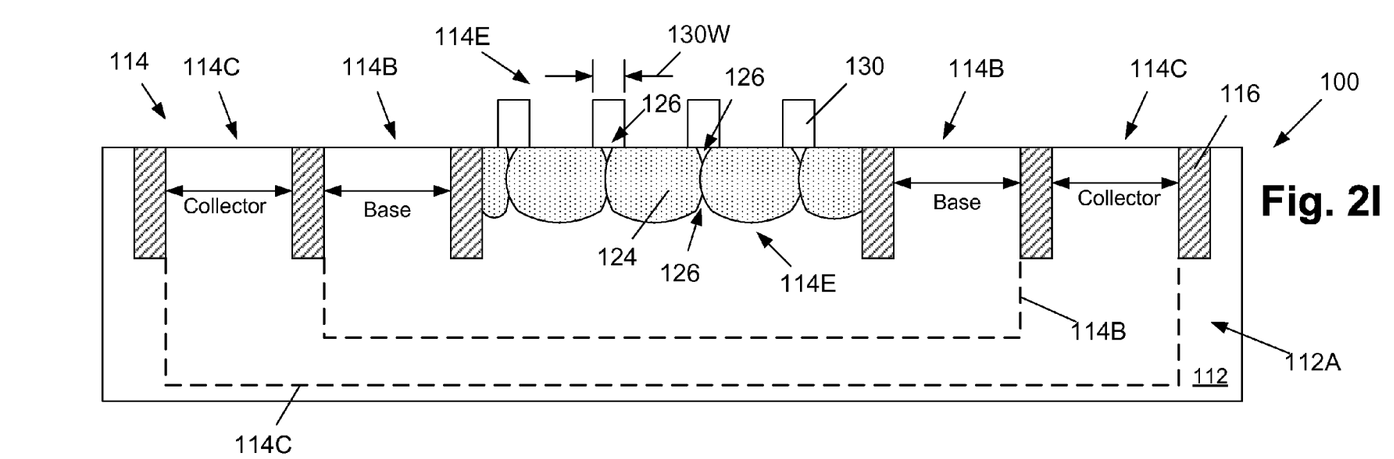
Figure 2J:
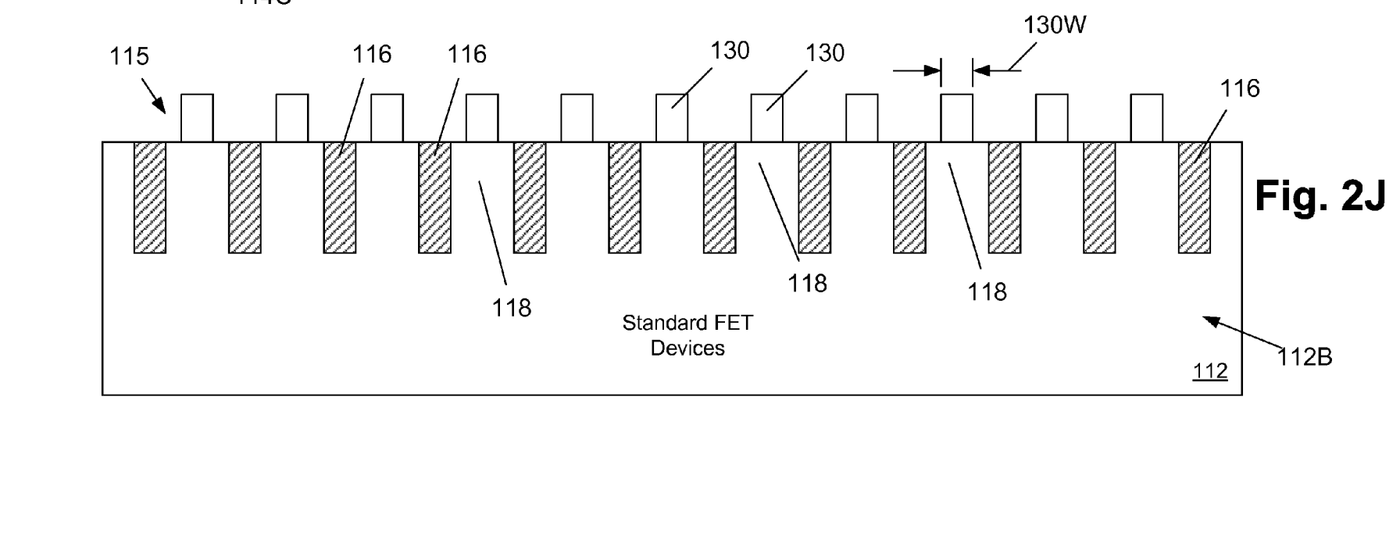

FIGS. 2I-2J depict the product 100 after schematically depicted final gate structures 130 have been formed in the regions 112A, 112B. Note that the final gate structures 130 formed above the emitter region 114E do not, in one embodiment, serve a functional purpose as it relates to the operation of the bipolar transistor 114. Thus, the reference to the structures 130 as "gate structures" is not intended to imply that the structures 130 function as any kind of "gate" for the bipolar transistor 114. Rather, the use of the phrase "gate structure" or "final gate structure" is used to mean that the structures 130 positioned above the emitter region 114 have the same materials of construction, size and pitch as some of the actual gate structures on some of the transistor devices 115 formed above the substrate region 112B. Of course, the structures 130 above the emitter region 114E may be formed of the same materials of the final gate structures of either the N-type or P-type transistor devices 115.

In general, a final gate structure 130 is typically comprised of an illustrative gate insulation layer (not shown) and one or more illustrative metal layers (not shown) that function as the gate electrode of the transistor devices 115. An illustrative gate cap layer (not shown) may also be formed above the illustrative gate electrode. The gate insulation layer may be comprised of a variety of different materials, such as, for example, a so-called high-k (k greater than 10) insulation material (where k is the relative dielectric constant), etc. Similarly, the gate electrode may be comprised of one or more metal layers that act as the gate electrode. Additionally workfunction adjusting metals may be formed as part of the gate structure in some applications. As will be recognized by those skilled in the art after a complete reading of the present application, the gate structure 130 depicted in the drawings, i.e., the gate insulation layer and the materials that make up the gate electrode, is intended to be representative in nature. That is, the gate structure 130 may be comprised of a variety of different materials and it may have a variety of configurations. Of course, depending upon the particular application, the materials of construction for the gate structure 130 of the N-type devices 115 may be different than the materials of construction for the gate structure 130 of the P-type devices 115. At this point, traditional manufacturing techniques may be performed to complete the manufacture of the product 100. For example, additional contacts and metallization layers may then be formed above the devices 114 and 115 using traditional techniques.

As will be appreciated by those skilled in the art after a complete reading of the present application, one illustrative method disclosed herein includes forming a plurality of first active regions 118 in a first region 112B of a semiconductor substrate 112 wherein a field effect transistor 115 will be formed in and above each of the first active regions 118, forming a second active region in a second region 112A of the semiconductor substrate 112 where a bipolar transistor 114 will be formed and performing at least one common process operation, such as a deposition or etching process, to form a first gate structure 120 above each of the first active regions 118 for each of the field effect transistors 115 and a plurality of second gate structures 120 above the second active region where the bipolar transistor 114 will be formed, wherein the bipolar transistor 114 comprises a continuous doped emitter region 114E that extends laterally under all of the plurality of second gate structures 120. In further embodiments, the first gate structures 120 and the second gate structures 120 may have the same materials of construction and the same critical lateral dimension 120W.

One illustrative device disclosed herein includes a first plurality of field effect transistor devices 115 positioned in and above a first region 112B of a semiconductor substrate 112, wherein each of the first plurality of field effect transistors 115 comprise a first gate structure, a bipolar transistor 114 formed in and above a second region 112A of the semiconductor substrate 112, wherein the bipolar transistor comprises a continuous doped emitter region 114E that extends laterally under all of the plurality of second gate structures 120 that are positioned above the continuous doped emitter region 114E. In further embodiments, the first and second gate structures are made from the same materials and they have the same critical lateral dimension.

As will be appreciated by those skilled in the art after a complete reading of the present application, the methods and devices disclosed herein provide unique advantages as compared to related prior art methods and devices. As a result of using the methods disclosed herein, there is substantially less loss in area of the emitter region 114E of the bipolar device 114 disclosed herein as the continuous doped emitter region extends laterally under all of the gate structures positioned above the emitter region. Thus, unlike the prior art bipolar device 10, the physical size of the emitter region 114E of the device 100 disclosed herein does not have to be enlarged in physical size, or at least not as much, to account for the excessive consumption of the area of the prior art emitter region 14E as discussed in the background section of this application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
  a first plurality of field effect transistor devices positioned in and above a first region of a semiconductor substrate, wherein each of said first plurality of field effect transistors comprises a first gate structure;
  a bipolar transistor formed in and above a second region of said semiconductor substrate, said bipolar transistor comprising a continuous doped emitter region; and
  a plurality of second gate structures positioned above said continuous doped emitter region, wherein said continuous doped emitter region extends laterally under all of said plurality of second gate structures.

2. The device of claim 1, wherein said first and second gate structures are one of dummy gate structures or final gate structures.

3. The device of claim 1, wherein said field effect transistor is one of a planar transistor device or a FinFET device and wherein said field effect transistor is one of an N-type transistor or a P-type transistor.

4. The device of claim 1, wherein said first gate structures and said second gate structures have the same materials of construction and the same critical lateral dimension.

5. A device, comprising:
  a first plurality of field effect transistor devices positioned in and above a first region of a semiconductor substrate, wherein each of said first plurality of field effect transistors comprises a first gate structure;
  a bipolar transistor formed in and above a second region of said semiconductor substrate, said bipolar transistor comprising a doped emitter region; and
  a plurality of second gate structures positioned above said doped emitter region, wherein said first gate structures and said second gate structures have the same materials of construction and the same critical lateral dimension.

6. The device of claim 5, wherein said first and second gate structures are one of dummy gate structures or final gate structures.

7. The device of claim 5, wherein said field effect transistor is one of a planar transistor device or a FinFET device and wherein said field effect transistor is one of an N-type transistor or a P-type transistor.

8. The device of claim 5, wherein said doped emitter region is a continuous doped emitter region that extends laterally under all of said plurality of second gate structures.

9. A device, comprising:
- a first plurality of field effect transistor devices positioned in and above a first region of a semiconductor substrate, wherein each of said first plurality of field effect transistors comprises a first gate structure and wherein each of said first plurality of field effect transistors is one of a planar transistor device or a FinFET device;
- a bipolar transistor formed in and above a second region of said semiconductor substrate, said bipolar transistor comprising a continuous doped emitter region; and
- a plurality of second gate structures positioned above said doped emitter region, wherein said continuous doped emitter region extends laterally under all of said plurality of second gate structures, wherein said first gate structures and said second gate structures have the same materials of construction and the same critical lateral dimension.

10. The device of claim 9, wherein said first and second gate structures are one of dummy gate structures or final gate structures.

* * * * *